United States Patent [19]

Arnold et al.

[11] Patent Number: 4,555,300
[45] Date of Patent: Nov. 26, 1985

[54] METHOD FOR PRODUCING SINGLE CRYSTAL LAYERS ON INSULATORS

[75] Inventors: Emil Arnold, Chappaqua; Helmut Baumgart; Barbara A. Rossi, both of Mahopac, all of N.Y.

[73] Assignee: North American Philips Corporation, New York, N.Y.

[21] Appl. No.: 581,752

[22] Filed: Feb. 21, 1984

[51] Int. Cl.[4] ............................................. C30B 25/06
[52] U.S. Cl. ............................ 156/613; 156/DIG. 64; 156/DIG. 73; 156/DIG. 80
[58] Field of Search ................ 156/612, 613, DIG. 64, 156/DIG. 73, DIG. 80; 427/93, 95, 53.1; 148/174; 219/121 L, 121 LE

[56] References Cited

U.S. PATENT DOCUMENTS 3,585,088  6/1971  Schwuttke et al. ................. 156/613
4,087,571  5/1978  Kamins et al. ........................ 427/86

FOREIGN PATENT DOCUMENTS 51-99971  3/1976  Japan .......................... 156/DIG. 64

OTHER PUBLICATIONS

Protection of Porous Silicon from Oxidation and Impurities, Dockerty et al., IBM Tech. Disc. Bull., V. 17, No. 6, Nov. 1974.

Hartstein et al., Observation of Amorphous Silicon Regions in Silicon-Rich Silicondioxide Films, Appl. Phys. Lett. 36 (10), May 1980, pp. 836, 837.

D. Dong et al., Preparation and Some Properties of Chemically Vapor-Deposited Si-Rich $SiO_2$ and $Si_3N_4$ Films, Journal of Electrochemical Society, Solid-State Science and Technology, vol. 125, No. 5, May 1978, pp. 819–823.

Maxwell, Jr., et al., Journal of Electrochemical Society, Solid-State Science and Technology, vol. 128, No. 3, Mar. 1981, pp. 576–580.

Primary Examiner—David L. Lacey
Attorney, Agent, or Firm—Paul R. Miller

[57] ABSTRACT

A monocrystalline layer of silicon is formed on an insulating substrate according to the present invention by use of a semi-insulating layer between the insulator and silicon film. This semi-insulating layer is composed of a mixture of silicon crystallites embedded in a silicon dioxide glass, for example. Such a technique results in a structure which is substantially free of cracking resulting from differences in thermal expansion coefficients between the insulating substrate and the monocrystalline silicon layer.

4 Claims, 1 Drawing Figure

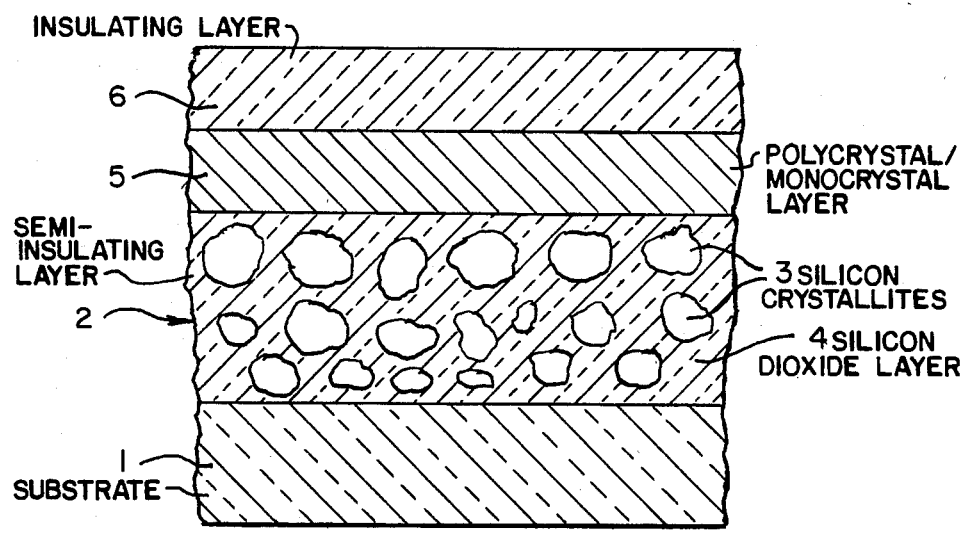

METHOD FOR PRODUCING SINGLE CRYSTAL LAYERS ON INSULATORS

The present invention relates to a method for producing a semiconductor device, and in particular, to a method for producing single crystal layers of silicon on insulating layers.

Silicon layers on insulators can be used for producing large area device arrays suitable for flat-panel displays, dielectrically isolated devices for high-voltage and high-frequency integrated circuits, and other applications. Such silicon films have been produced by depositing a polycrystalline silicon film on a suitable substrate, such as quartz, by chemical vapor deposition, and subsequently converting the polycrystalline film to a single crystal material by irradiation with a laser beam or other high-intensity light source. Alternatively, an electron beam has been used. The recrystallized silicon film then can be used for fabrication of transistor devices by conventional silicon technology.

Silicon films produced by this prior art technique are subject to cracking because of differences in thermal expansion coefficients between the insulating substrate and the silicon film. Moreover, prior art techniques have resulted in extensive and time consuming processes, such as found in U.S. Pat. Nos. 4,323,417 to Lam, 4,414,242 to Nishimura et al and 4,383,883 to Mizutani. These latter prior art attempts of producing silicon films on insulators have involved the forming of grooves and ridges on an underlying insulating layer, forming single crystalline layers in the grooves and polycrystalline structure on the ridges, and thereafter, upon heating with lasers recrystallizing the structure to a single crystalline arrangement.

On the other hand, the patent to Lam involves applying a polycrystalline silicon layer over a substrate of a relatively thick single crystal of silicon having thin insulator areas thereon. In this prior technique, monocrystalline growth takes place on the single crystal substrate areas and polycrystalline growth takes place on the insulator areas. Thereafter, the polycrystalline silicon layer on the insulator areas is converted to a monocrystalline form by application of a scanning laser. The problem of cracking occurring by differences in thermal expansion coefficients between materials is not important in this case because the silicon substrate has the same thermal expansion coefficient as the grown or converted silicon layer, and the insulator areas are thin.

The present invention pertains to a method resulting in a substantial reduction of cracking particularly where the thermal expansion coefficient of the substrate is substantially different from that of silicon. Such an easy technique for forming monocrystalline silicon films on insulators according to the present invention is crucial to making this technology viable.

The essential features of the present invention involve forming a semi-insulating film or silicon-rich oxide film of single crystallites embedded in an insulating layer. This semi-insulating layer is formed onto a substrate, which is itself an insulating layer, and the monocrystalline silicon to be formed is thereafter formed by depositing a polycrystalline film onto the semi-insulating film and converting the polycrystalline film into a single crystal film by a laser. The intervening semi-insulating film of single crystallites, such as silicon, embedded into an insulating layer, such as silicon dioxide, provides a layer having a thermal expansion coefficient value lying between that of the substrate insulating layer, such as silicon dioxide, and the overlying silicon layer so as to avoid problems of cracking the monocrystalline silicon layer.

The technique of the presently claimed invention may be more clearly seen by reference to the drawing figure which illustrates without limitation a structure formed according to the technique of the present invention.

The drawing figure is not shown to scale in order to more clearly illustrate the semi-insulating layer of single crystallites embedded into an insulating layer according to the present invention.

Essentially the structure produced by the present invention involves a substrate layer 1 which is an insulator having a sufficiently different coefficient of thermal expansion than that of the formed monocrystalline layer 5, which can be silicon. Typical of such substrate insulators would be quartz, for example, in the case of growing silicon. According to the present invention before the monocrystalline silicon film 5 is produced on the insulating substrate layer 1, a semi-insulating layer 2 is first formed on the insulating substrate layer 1. This semi-insulating film or layer 2 involves a mixture of silicon crystallites 3 embedded into silicon dioxide matrix 4 which may be formed in an amorphous or glassy state.

The semi-insulating film being formed of silicon crystallites in a silicon dioxide matrix has been found to have a thermal expansion coefficient value lying between that of silicon and silicon dioxide or quartz. Such a semi-insulating film may be prepared at low pressures by a chemical vapor deposition (CVD) technique. For example, a mixture of silane ($SiH_4$) and nitrous oxide ($N_2O$) or carbon dioxide ($CO_2$) reacts in a heated and partially evacuated chamber to deposit a thin film of the semi-insulating layer 2 onto the surface of an insulating substrate 1.

Typical deposition techniques utilized for a mixture of silane and nitrous oxide would involve a temperature of around 650° C., a pressure of about 0.3 torr, and a silane to nitrous oxide ratio of 2:1. Under these conditions, the silane and nitrous oxide convert to amorphous silicon in a silicon dioxide matrix, and gaseous products of $N_2$ and $H_2$ are given off. A semi-insulating film is then grown to a thickness of at least one micron.

The film formed by the reaction of $SiH_4$ and $N_2O$ consists essentially of a mixture of amorphous silicon and silicon dioxide. After annealing by heating the film to a temperature of about 900° C.–1100° C., the amorphous silicon in the film becomes converted to small silicon crystallites of between 5 nanometers (nm) and 10 nm in size. Alternatively, such annealing need not take place since the conversion to small crystallites 3 also takes place upon application of laser energy, for example, in converting a subsequently applied polycrystalline silicon layer into a monocrystalline silicon layer 5.

The essential feature of the film is the mixture of silicon crystallites 3 embedded into a silicon dioxide glass structure 4.

Subsequently, ordinary silicon-on-insulator technology can be used. That is, a polycrystalline silicon film deposited on the semi-insulating film 2 by a standard chemical vapor deposition technique is capped with an insulating layer 6, such as silicon dioxide, silicon nitride, or even the above-described semi-insulating film. This layer 6 prevents the underlying silicon film 5 from flowing at the high temperatures used to anneal and/or convert to monocrystalline form. Thereafter, the polycrystalline silicon film is converted into the single crystal film 5 by use of a laser beam or other high intensity light or heat source. Electron beam scanning can also be utilized to convert the polycrystalline film into a monocrystalline film.

The structure thus formed can be utilized in the making of numerous solid state devices.

What we claim:

1. A method for producing single crystal layers on an insulating layer comprising;

forming a first insulating substrate layer, forming a semi-insulating film of small silicon crystallites embedded into a second insulating layer of silicon dioxide on said first insulating substrate layer, said semi-insulating film being a silicon-rich oxide layer, and said semi-insulating film having a coefficient of thermal expansion intermediate that of silicon and silicon dioxide, depositing a polycrystalline semiconductor film of silicon onto said semi-insulating film, forming a third insulating layer on said polycrystalline semiconductor film, and converting said polycrystalline semiconductor film to a single crystal film.

2. A method according to claim 1, wherein said semi-insulating film is formed by depositing a mixture of silane and nitrous oxide on said first insulating film at a temperature of about 650° C., pressure of about 0.3 torr, and a $SiH_4/N_2O$ ratio of 2:1, said semi-insulating film being formed to a thickness of at least 1 micron, and thereafter annealing at a temperature of at least 900° C.

3. A method according to claim 1, wherein said polycrystalline semiconductor film is converted to said single crystal film by irradiation of said polycrystalline semiconductor film by a laser or other high intensity light or heat source.

4. A method according to claim 1, wherein said first insulating layer is quartz.

* * * * *